(12) United States Patent
Doering et al.

(10) Patent No.: US 11,245,395 B2
(45) Date of Patent: Feb. 8, 2022

(54) CIRCUIT ARRANGEMENT AND CONVERTER MODULE WITH SWITCH ASSEMBLIES CONNECTED IN SERIES

(71) Applicant: Siemens Aktiengesellschaft, Munich (DE)

(72) Inventors: David Doering, Herzogenaurach (DE); Gerald Franz Giering, Kalchreuth (DE); Klaus Wuerflinger, Nuremberg (DE)

(73) Assignee: Siemens Energy Global GmbH & CO. KG, Munich (DE)

( * ) Notice: Subject to any disclaimer, the term of this patent is extended or adjusted under 35 U.S.C. 154(b) by 0 days.

(21) Appl. No.: 17/048,218

(22) PCT Filed: Apr. 16, 2018

(86) PCT No.: PCT/EP2018/059669
§ 371 (c)(1),
(2) Date: Oct. 16, 2020

(87) PCT Pub. No.: WO2019/201420
PCT Pub. Date: Oct. 24, 2019

(65) Prior Publication Data
US 2021/0159899 A1    May 27, 2021

(51) Int. Cl.
*H03K 17/567* (2006.01)
(52) U.S. Cl.
CPC .................. *H03K 17/567* (2013.01)
(58) Field of Classification Search
CPC .................................................. H03K 17/567

USPC .......................................................... 307/43
See application file for complete search history.

(56) References Cited

U.S. PATENT DOCUMENTS

| 9,717,164 | B2 | 7/2017 | Hetzel et al. | |
|---|---|---|---|---|
| 9,780,658 | B2 | 10/2017 | Eckel et al. | |
| 2009/0261793 | A1* | 10/2009 | Urakabe | H02M 3/158 323/282 |
| 2017/0126224 | A1* | 5/2017 | Seely | H02M 7/5395 |

FOREIGN PATENT DOCUMENTS

| EP | 2996449 A1 | 3/2016 |
|---|---|---|
| EP | 3002866 A1 | 4/2016 |
| GB | 2438464 A | 11/2007 |

* cited by examiner

*Primary Examiner* — Metasebia T Retebo
(74) *Attorney, Agent, or Firm* — Laurence A. Greenberg; Werner H. Stemer; Ralph E. Locher

(57) ABSTRACT

A circuit arrangement includes two switching group series circuits of switch assemblies, switch-mode power supply units, and two capacitor bridges connecting the switching group series circuits. Each switch assembly has a parallel circuit of a semiconductor switch and a freewheeling diode as well as a driver for actuating the semiconductor switch. Each switch-mode power supply unit is associated with a switch pair of semiconductor switches and supplies the drivers of both semiconductor switches of the switch pair with energy. Each switch pair is formed by a semiconductor switch of a first switching group series circuit and a semiconductor switch of a second switching group series circuit. A power convertor module having the circuit arrangement is also provided.

13 Claims, 2 Drawing Sheets

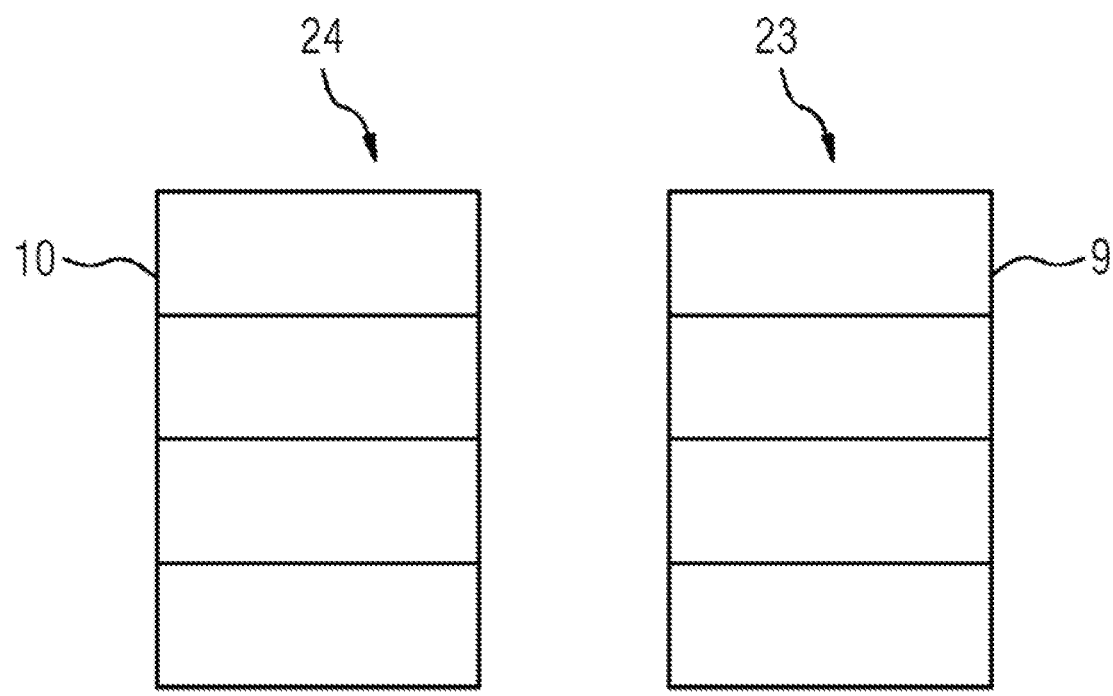

CIRCUIT ARRANGEMENT AND CONVERTER MODULE WITH SWITCH ASSEMBLIES CONNECTED IN SERIES

BACKGROUND OF THE INVENTION

Field of the Invention

The invention relates to a circuit arrangement having series-connected switch assemblies, each comprising a semiconductor switch, and a power convertor module comprising a circuit arrangement of this type.

Semiconductor switches such as an insulated gate bipolar transistor (IGBT) are governed by a driver, which has to be supplied with electrical energy. Power convertor modules, in particular, often have a series circuit formed by switch assemblies, each comprising a semiconductor switch. The invention relates, in particular, to the energy supply of the drivers of the semiconductor switches of such a series circuit. A driver of an individual semiconductor switch is for example often supplied with energy from a capacitor connected to the semiconductor switch. However, this type of energy supply of a driver of a semiconductor switch is associated with difficulties in the case of a series circuit formed by switch assemblies because energy is coupled out either from a capacitor circuit for the entire series circuit formed by the switch assemblies and thus from a generally very high voltage or from only one capacitor of a plurality of capacitors connected in series, the voltages of which are subject to fluctuations of the voltage sharing between the capacitors.

SUMMARY OF THE INVENTION

The invention is based on the object of specifying a circuit arrangement and a power convertor module which have series-connected switch assemblies each comprising a semiconductor switch and are improved in particular with regard to the energy supply of the drivers of the semiconductor switches.

The object is achieved according to the invention by means of a circuit arrangement having the features described below and a power convertor module having the features described below.

The dependent claims relate to advantageous configurations of the invention.

A circuit arrangement according to the invention comprises a plurality of first switch assemblies connected in series, which form a first switching group series circuit, a number—corresponding to the number of first switch assemblies—of second switch assemblies connected in series, which form a second switching group series circuit, a number of switch-mode power supply units corresponding to the number of first switch assemblies, and two capacitor bridges each having at least one capacitor. Each switch assembly has a semiconductor switch having a control terminal and two load terminals and a driver for driving the semiconductor switch via the control terminal thereof. A first capacitor bridge is electrically connected to a first end of the first switching group series circuit and a first end of the second switching group series circuit. The second capacitor bridge is electrically connected to the second end of the first switching group series circuit and the second end of the second switching group series circuit. Each switch-mode power supply unit is assigned to a switch pair of semiconductor switches and supplies the drivers of both semiconductor switches of the switch pair with energy. In this case, each switch pair is formed by the semiconductor switch of a first switch assembly and the semiconductor switch of that second switch assembly whose position in the second switching group series circuit relative to the first end of the second switching group series circuit corresponds to the position of the first switch assembly in the first switching group series circuit relative to the first end of the first switching group series circuit.

The invention thus provides for supplying the drivers of the semiconductor switches of the switch assemblies with energy in pairs by means of a respective switch-mode power supply unit. In this case, the two semiconductor switches whose drivers are supplied with energy by the same switch-mode power supply unit are arranged at mutually corresponding positions in two switching group series circuits of the switch assemblies which are connected to one another by two capacitor bridges. The invention takes account of the fact that mutually corresponding load terminals of mutually different semiconductor switches are at mutually different electrical potentials in the case where the semiconductor switches are connected in a series circuit. In the case of a common energy supply of the drivers of two semiconductor switches by a respective common switch-mode power supply unit, this potential difference has to be compensated for by the switch-mode power supply unit. It is therefore advantageous to minimize the potential difference between the two semiconductor switches of each switch pair supplied by a switch-mode power supply unit. This is achieved by means of the arrangement according to the invention of the switch assemblies in two switching group series circuits connected by two capacitor bridges with mutually corresponding positions of the semiconductor switches of a switch pair in the two switching group series circuits.

One configuration of the invention provides that the first switch assemblies are arranged spatially one above another or next to one another in a first assembly stack and the second switch assemblies are arranged in a second assembly stack in a manner corresponding to the first switch assemblies, that is to say one above another or next to one another like the first switch assemblies. Preferably, in this case the switch assemblies of each assembly stack are arranged one above another or next to one another in the order of their switching group series circuit. As a result, the spatial arrangement of the switch assemblies is advantageously adapted to the electrical interconnection of the switch assemblies. This enables, in particular, a particularly simple realization of the interconnection of the switch assemblies of the assembly stacks.

A further configuration of the invention provides that each switch-mode power supply unit is supplied with energy by a semiconductor switch of that switch pair to which the switch-mode power supply unit is assigned, from an electrical voltage between the load terminals of the semiconductor switch. By way of example, in this case each switch-mode power supply unit is supplied with energy by the semiconductor switch of a first switch assembly. In accordance with this configuration of the invention, a voltage present at a semiconductor switch of a switch pair is used to supply the switch-mode power supply unit of the respective switch pair with energy. This avoids the problems mentioned above that occur in the case of an energy supply of the drivers of the semiconductor switches from a capacitor circuit.

A further configuration of the invention provides that each switch assembly has a freewheeling diode connected in parallel with the semiconductor switch. The semiconductor switches are thereby protected against overvoltages in the event of changes in their switching states.

In a further configuration of the invention, each semiconductor switch is an insulated gate bipolar transistor (IGBT), the load terminals of which are its emitter and its collector and the control terminal of which is its gate. In this case, the semiconductor switches of each two switch assemblies succeeding one another in their series circuit are electrically connected to one another for example by an electrical connection of the emitter of one of the two semiconductor switches and the collector of the other of the two semiconductor switches. Insulated gate bipolar transistors combine advantages of bipolar transistors and field effect transistors and are therefore particularly suitable semiconductor switches, in particular for circuit arrangements for power convertor modules.

Further configurations of the invention provide that each capacitor bridge has a series circuit formed by a plurality of capacitors, and/or that the capacitor bridges are embodied identically. As a result of a series circuit formed by capacitors, a high voltage can be shared among a plurality of capacitors and, consequently, it is advantageously possible to use smaller and more cost-effective capacitors with a lower dielectric strength than in the case of capacitor bridges comprising in each case only one capacitor. An identical embodiment of the capacitor bridges realizes a symmetrical implementation of the circuit arrangement and reduces the component diversity compared with an embodiment of the capacitor bridges comprising mutually different capacitors.

A power convertor module according to the invention comprises a circuit arrangement according to the invention and two module terminals. A first module terminal is electrically connected to the first end of the first switching group series circuit. The second module terminal is electrically connected to the second end of the first switching group series circuit. The advantages of a power convertor module according to the invention are evident from the abovementioned advantages of a circuit arrangement according to the invention.

The above-described properties, features and advantages of this invention and the way in which they are achieved will become clearer and more clearly understood in association with the following description of exemplary embodiments which are explained in greater detail in association with the drawings.

BRIEF DESCRIPTION OF THE SEVERAL VIEWS OF THE DRAWING

FIG. 2 shows a spatial arrangement of switch assemblies of a power convertor module.

DETAILED DESCRIPTION OF THE INVENTION

Figure 1:
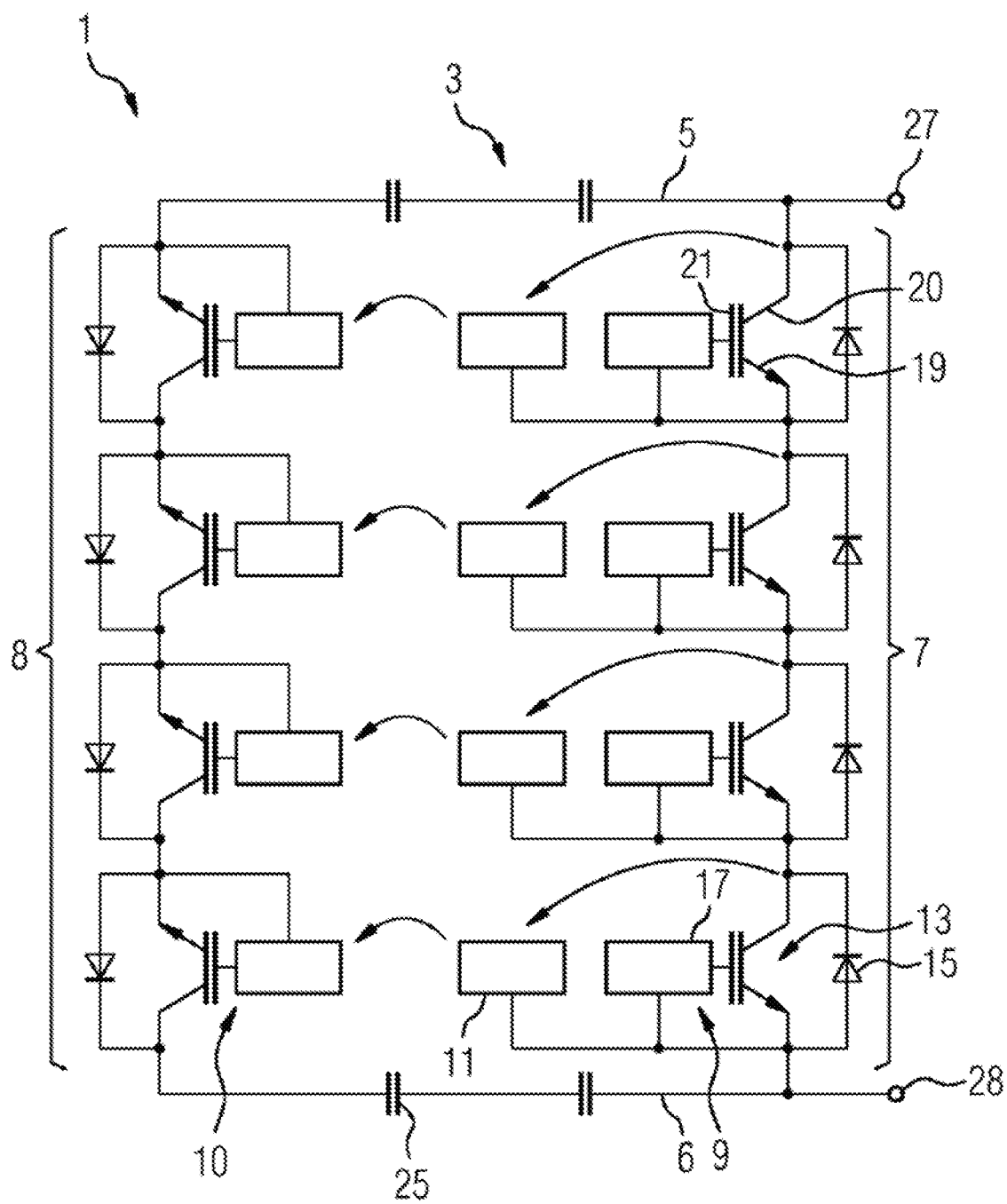
FIG. 1 shows a circuit diagram of a power convertor module.

Mutually corresponding parts are provided with the same reference signs in the figures.

FIG. 1 shows a circuit diagram of a power convertor module 1 according to the invention. The power convertor module 1 comprises a circuit arrangement 3 according to the invention and two module terminals 27, 28.

The circuit arrangement 3 comprises four first switch assemblies 9 connected in series, which form a first switching group series circuit 7, four second switch assemblies 10 connected in series, which form a second switching group series circuit 8, four switch-mode power supply units 11 and two capacitor bridges 5, 6. Each switch assembly 9, 10 has a parallel circuit formed by a semiconductor switch 13 and a freewheeling diode 15 and also a driver 17 for driving the semiconductor switch 13.

Each semiconductor switch 13 is embodied as an IGBT and has two load terminals 19, 20 and a control terminal 21, via which the semiconductor switch 13 is driven by the driver 17. A first load terminal 19 is the emitter of the IGBT, the second load terminal 20 is the collector of the IGBT, and the control terminal 21 is the gate of the IGBT.

Each capacitor bridge 5, 6 has two capacitors 25 connected in series. A first capacitor bridge 5 is electrically connected to a first end of the first switching group series circuit 7 and a first end of the second switching group series circuit 8. The second capacitor bridge 6 is electrically connected to the second end of the first switching group series circuit 7 and the second end of the second switching group series circuit 8.

Each switch-mode power supply unit 11 is assigned to a switch pair of semiconductor switches 13 and supplies the drivers 17 of both semiconductor switches 13 of the switch pair with energy. Each switch pair is formed by the semiconductor switch 13 of a first switch assembly 9 and the semiconductor switch 13 of that second switch assembly 10 whose position in the second switching group series circuit 8 relative to the first end thereof corresponds to the position of the first switch assembly 9 in the first switching group series circuit 7 relative to the first end thereof.

Each switch-mode power supply unit 11 is supplied with energy by the semiconductor switch 13 of the first switch assembly 9 of that switch pair to which the switch-mode power supply unit 11 is assigned, from an electrical voltage between the load terminals 19, 20 of the semiconductor switch 13. The switch-mode power supply unit 11 is configured to measure the voltage present between the two load terminals 19, 20 and to couple out energy from said voltage when the semiconductor switch 13 is turned off (blocking) and the freewheeling diode 15 is not conducting. Furthermore, the switch-mode power supply unit 11 takes account of a potential difference between the mutually corresponding load terminals 19, 20 (for example between the emitters 19) of the two semiconductor switches 13 whose drivers 17 are supplied with energy by said switch-mode power supply unit. The mutually corresponding arrangement of the two semiconductor switches 13 of a switch pair in the two switching group series circuits 7, 8 advantageously brings about a relatively small potential difference between the two semiconductor switches 13 of the switch pair. The energy supply of the switch-mode power supply units 11 in each case by the voltage at a semiconductor switch 13 of a first switch assembly 9 and the energy supply of the drivers 17 of the semiconductor switches 13 of the second switch assembly 10 by a respective switch-mode power supply unit 11 are indicated in each case by an arrow in FIG. 1.

The semiconductor switches 13 of each two switch assemblies 9, 10 succeeding one another in a switching group series circuit 7, 8 are electrically connected to one another by an electrical connection of the emitter 19 of one of the two semiconductor switches 13 and the collector 20 of the other of the two semiconductor switches 13.

The anode of the freewheeling diode 15 of a switch assembly 9, 10 is connected to the emitter 19 of the semiconductor switch 13 of the switch assembly 9, 10. The cathode of the freewheeling diode 15 of a switch assembly 9, 10 is connected to the collector 20 of the semiconductor switch 13 of the switch assembly 9, 10.

A first module terminal 27 is connected to the first end of the first switching group series circuit 7. The second module terminal 28 is connected to the second end of the first switching group series circuit 7.

FIG. 2 shows the spatial arrangement of the switch assemblies 9, 10. The first switch assemblies 9 are arranged one above another in a first assembly stack 23. The second switch assemblies 10 are arranged one above another in a second assembly stack 24. The two assembly stacks 23, 24 are arranged next to one another. The switch assemblies 9, 10 of each assembly stack 23, 24 are arranged one above another in the order of their switching group series circuit 7, 8.

The exemplary embodiments of a circuit arrangement 3 and of a power convertor module 1 as shown in FIGS. 1 and 2 can be modified in various ways. By way of example, a number of first switch assemblies 9, second switch assemblies 10 and switch-mode power supply units 11 which is different than four and/or a number of capacitors 25 in the capacitor bridges 5, 6 which is different than two can be provided. Furthermore, provision can be made for enabling, in addition to the energy supply of the switch-mode power supply units 11 from voltages present at the semiconductor switches 13 of the first switch assemblies 9, a redundant energy supply of the switch-mode power supply units 11, for example from a current or the capacitor bridges 5, 6, which redundant energy supply can be used as required.

Although the invention has been more specifically illustrated and described in detail by means of preferred exemplary embodiments, nevertheless the invention is not restricted by the examples disclosed and other variations can be derived therefrom by the person skilled in the art, without departing from the scope of protection of the invention.

LIST OF REFERENCE SIGNS

1 Power convertor module
3 Circuit arrangement
5, 6 Capacitor bridge
7, 8 Switching group series circuit
9, 10 Switch assembly
11 Switch-mode power supply unit
13 Semiconductor switch
15 Freewheeling diode
17 Driver
19, 20 Load terminal
21 Control terminal
23, 24 Assembly stack
25 Capacitor
27, 28 Module terminal

The invention claimed is:

1. A circuit arrangement, comprising:
a number of first switch assemblies being connected in series and forming a first switching group series circuit having first and second ends;
a number of second switch assemblies connected in series and forming a second switching group series circuit having first and second ends, said number of second switch assemblies corresponding to said number of first switch assemblies;
a number of switch-mode power supply units corresponding to said number of first switch assemblies;
each of said first switch assemblies and each of said second switch assemblies including a semiconductor switch having a control terminal and two load terminals and a driver for driving said semiconductor switch at said control terminal of said semiconductor switch;
first and second capacitor bridges each having at least one respective capacitor;
said first capacitor bridge being electrically connected to said first end of said first switching group series circuit and to said first end of said second switching group series circuit;
said second capacitor bridge being electrically connected to said second end of said first switching group series circuit and to said second end of said second switching group series circuit;
each of said switch-mode power supply units being associated with a respective switch pair of said semiconductor switches and supplying said drivers of both semiconductor switches of said switch pair with energy;
a respective one of said semiconductor switches of said first switch assemblies being disposed in a position in said first switching group series circuit relative to said first end of said first switching group series circuit; and
a respective one of said semiconductor switches of said second switch assemblies being disposed in a position in said second switching group series circuit relative to said first end of said second switching group series circuit corresponding to said position of said first switch assembly in said first switching group series circuit forming one of said switch pairs;
wherein the number of first switch assemblies is nonzero and the number of second switch assemblies is nonzero; and
wherein said semiconductor switches of said first switch assemblies are connected to supply power to said switch-mode power supply units.

2. The circuit arrangement according to claim 1, wherein said first switch assemblies are disposed spatially one above another or next to one another in a first assembly stack and said second switch assemblies are disposed one above another or next to one another corresponding to said first switch assemblies in a second assembly stack.

3. The circuit arrangement according to claim 2, wherein said switch assemblies of each of said assembly stacks are disposed one above another or next to one another in an order in said switching group series circuits.

4. The circuit arrangement according to claim 1, wherein each of said switch-mode power supply units is supplied with energy by said semiconductor switch of said switch pair with which said switch-mode power supply unit is associated, and the energy is provided from an electrical voltage between said load terminals of said semiconductor switch.

5. The circuit arrangement according to claim 4, wherein each of said switch-mode power supply units is supplied with energy by said semiconductor switch of one of said first switch assemblies.

6. The circuit arrangement according to claim 1, wherein each of said switch assemblies includes a respective freewheeling diode connected in parallel with said semiconductor switch.

7. The circuit arrangement according to claim 1, wherein each of said semiconductor switches is a respective insulated gate bipolar transistor, said load terminals are an emitter and a collector of said insulated gate bipolar transistor and said control terminal is a gate of said insulated gate bipolar transistor.

8. The circuit arrangement according to claim 7, wherein said semiconductor switches of each two of said switch assemblies succeeding one another in a respective one of said switching group series circuits are electrically connected to one another by an electrical connection of said emitter of one of said two semiconductor switches and said collector of another of said two semiconductor switches.

9. The circuit arrangement according to claim 1, wherein said at least one capacitor of each respective capacitor bridge is a plurality of capacitors in a series circuit.

10. The circuit arrangement according to claim 9, wherein said capacitor bridges are identical.

11. A power convertor module, comprising:
a circuit arrangement according to claim 1;
a first module terminal electrically connected to said first end of said first switching group series circuit; and
a second module terminal electrically connected to said second end of said first switching group series circuit.

12. The power convertor module according to claim 11, wherein the number of switch-mode power supply units is equal to said number of first switch assemblies.

13. The circuit arrangement according to claim 1, wherein the number of switch-mode power supply units is equal to said number of first switch assemblies.

* * * * *